(12) United States Patent
Nomura et al.

(10) Patent No.: US 12,456,642 B2
(45) Date of Patent: Oct. 28, 2025

(54) MODULE

(71) Applicant: Murata Manufacturing Co., Ltd., Kyoto-fu (JP)

(72) Inventors: Tadashi Nomura, Nagaokakyo (JP); Tetsuo Sato, Nagaokakyo (JP)

(73) Assignee: MURATA MANUFACTURING CO., LTD., Kyoto-fu (JP)

( * ) Notice: Subject to any disclaimer, the term of this patent is extended or adjusted under 35 U.S.C. 154(b) by 601 days.

(21) Appl. No.: 17/816,014

(22) Filed: Jul. 29, 2022

(65) Prior Publication Data

US 2022/0367233 A1 Nov. 17, 2022

Related U.S. Application Data

(63) Continuation of application No. PCT/JP2021/001984, filed on Jan. 21, 2021.

(30) Foreign Application Priority Data

Feb. 3, 2020 (JP) .................................. 2020-016296

(51) Int. Cl.
| | |
|---|---|
| *H01L 21/683* | (2006.01) |
| *H01L 23/498* | (2006.01) |
| *H01L 23/552* | (2006.01) |
| *H01L 23/66* | (2006.01) |
| *H01L 25/16* | (2023.01) |

(52) U.S. Cl.
CPC .... *H01L 21/6836* (2013.01); *H01L 23/49811* (2013.01); *H01L 23/49816* (2013.01); *H01L 23/49838* (2013.01); *H01L 23/552* (2013.01); *H01L 23/66* (2013.01); *H01L 25/165* (2013.01); *H01L 2221/68345* (2013.01); *H01L 2221/68386* (2013.01); *H01L 2223/6677* (2013.01)

(58) Field of Classification Search
CPC ....... H01L 23/49894; H01L 2924/3025; H01L 2223/6677
See application file for complete search history.

(56) References Cited

U.S. PATENT DOCUMENTS

2002/0003293 A1* 1/2002 Kobayashi .............. H01L 24/32
257/676
2016/0111375 A1   4/2016 Bair
2016/0300799 A1* 10/2016 Han .................... H01L 21/6835
(Continued)

FOREIGN PATENT DOCUMENTS

JP   2002-026198 A   1/2002
JP   2010-177303 A   8/2010
(Continued)

OTHER PUBLICATIONS

International Search Report for PCT/JP2021/001984 dated Apr. 6, 2021.

*Primary Examiner* — Shih Tsun A Chou
(74) *Attorney, Agent, or Firm* — McDonald Hopkins LLC

(57) ABSTRACT

A module includes: a substrate having a first surface and a second surface opposed to each other; a component mounted on the first surface; a sealing resin that covers the first surface and the component; a shield film formed to cover an upper surface and a side surface of the sealing resin and a side surface of the substrate; and a resist film formed to cover the second surface. The resist film has a plurality of protrusions.

17 Claims, 12 Drawing Sheets

(56) References Cited

U.S. PATENT DOCUMENTS

| | | | |
|---|---|---|---|
| 2018/0151485 A1* | 5/2018 | Kao | H01L 21/486 |
| 2018/0159217 A1 | 6/2018 | Mikata et al. | |
| 2018/0342470 A1* | 11/2018 | Liao | H01L 23/552 |
| 2020/0219784 A1* | 7/2020 | Kim | H01L 23/4334 |
| 2020/0303336 A1 | 9/2020 | Otsubo et al. | |
| 2020/0402897 A1* | 12/2020 | Yeh | H01L 23/49816 |

FOREIGN PATENT DOCUMENTS

| | | |
|---|---|---|
| JP | 2010-245931 A | 10/2010 |
| JP | 2018-093015 A | 6/2018 |
| WO | 2019/111873 A1 | 6/2019 |

* cited by examiner

MODULE

CROSS REFERENCE TO RELATED APPLICATION

This is a continuation of International Application No. PCT/JP2021/001984 filed on Jan. 21, 2021 which claims priority from Japanese Patent Application No. 2020-016296 filed on Feb. 3, 2020. The contents of these applications are incorporated herein by reference in their entireties.

BACKGROUND OF THE DISCLOSURE

Field of the Disclosure

The present disclosure relates to a module.

Description of the Related Art

U.S. Patent Application Publication No. US2016/0111375A1 (PTL 1) discloses a method of forming a metal film as a shield film on an upper surface and a side surface of an LGA package. The method includes a step of affixing a land grid array (LGA) package onto an adhesive layer on an upper surface of a carrier wafer, on which a metal film is formed from above by vapor deposition, and thereafter, the LGA package is held by a vacuum nozzle by suction and peeled off from the adhesive layer and then lifted. This allows production of the LGA package on which a metal film is formed to cover the upper surface and the side surface of the LGA package. PTL 1 also discloses an example in which a ball grid array (BGA) package is used in place of the LGA package.

PTL 1: U.S. Patent Application Publication No. US2016/0111375A1

BRIEF SUMMARY OF THE DISCLOSURE

Balls on the BGA package and lands on the LGA package as disclosed in PTL 1 are generally used as terminals for connection to an external substrate. The types of such terminals for external connection include, for example, a signal terminal and a ground terminal. In order to reliably isolate these terminals from each other, a resist film may be provided.

When a package provided with such a resist film and attached to a pressure-sensitive adhesive sheet is peeled off from the pressure-sensitive adhesive sheet, the portions in surface contact with each other by adhesion are peeled off from each other at one time. Thus, a part of the adhesive on the pressure-sensitive adhesive sheet may be separated as a lump having a substantial area from the pressure-sensitive adhesive sheet and may remain attached to the package side. This phenomenon is also referred to as "glue residue", which is an example of defects in product.

Thus, an object of the present disclosure is to provide a module capable of preventing glue residue occurring during peeling-off from an adhesive layer after formation of a shield film.

To achieve the above-described object, a module according to the present disclosure includes: a substrate having a first surface and a second surface opposed to each other; a component mounted on the first surface; a sealing resin that covers the first surface and the component; a shield film formed to cover an upper surface and a side surface of the sealing resin and a side surface of the substrate; and a resist film formed to cover the second surface. The resist film has a plurality of protrusions.

According to the present disclosure, the resist film has a plurality of protrusions, and therefore, glue residue occurring during peeling-off from the adhesive layer after formation of the shield film can be prevented.

DETAILED DESCRIPTION OF THE DISCLOSURE

The dimension ratio shown in each of the figures does not always faithfully show the actual dimension ratio, but may show the dimension ratio in an exaggerated manner for the sake of explanation. In the following description, mentioning the concept of "upper" or "lower" does not necessarily indicate an absolute upper or lower position, but may indicate a relatively upper or lower position in the posture shown in each figure.

First Embodiment

A module according to the first embodiment of the present disclosure will be hereinafter described with reference to FIGS. 1 to 6.

Figure 1:
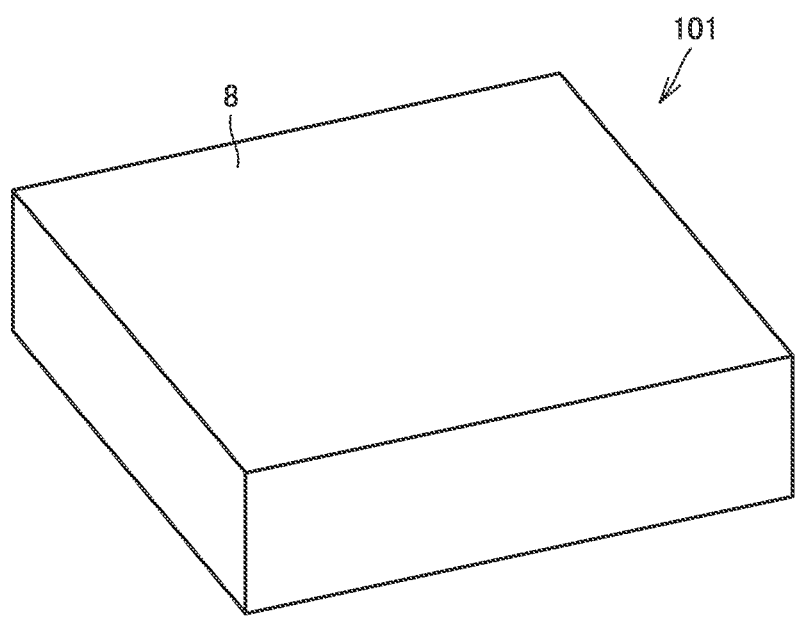
FIG. 1 is a first perspective view of a module according to a first embodiment of the present disclosure.
Figure 2:
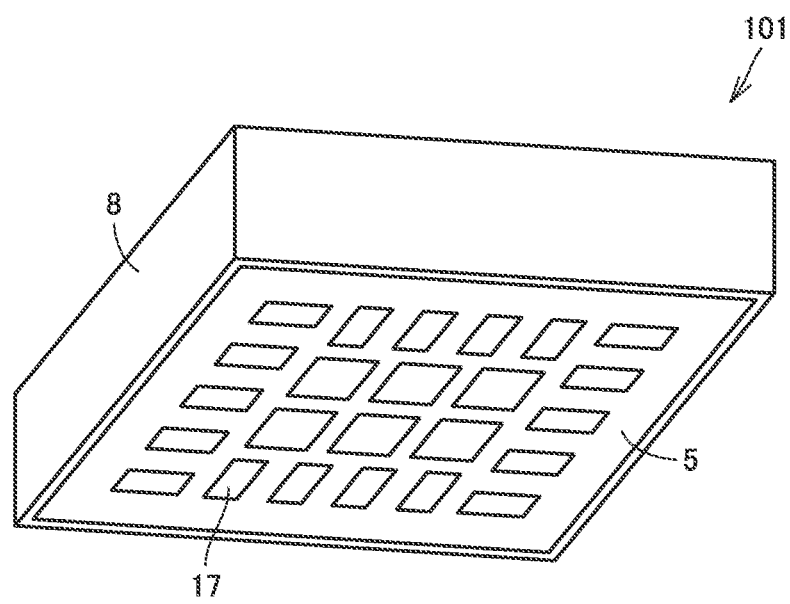
FIG. 2 is a second perspective view of the module according to the first embodiment of the present disclosure.
Figure 3:
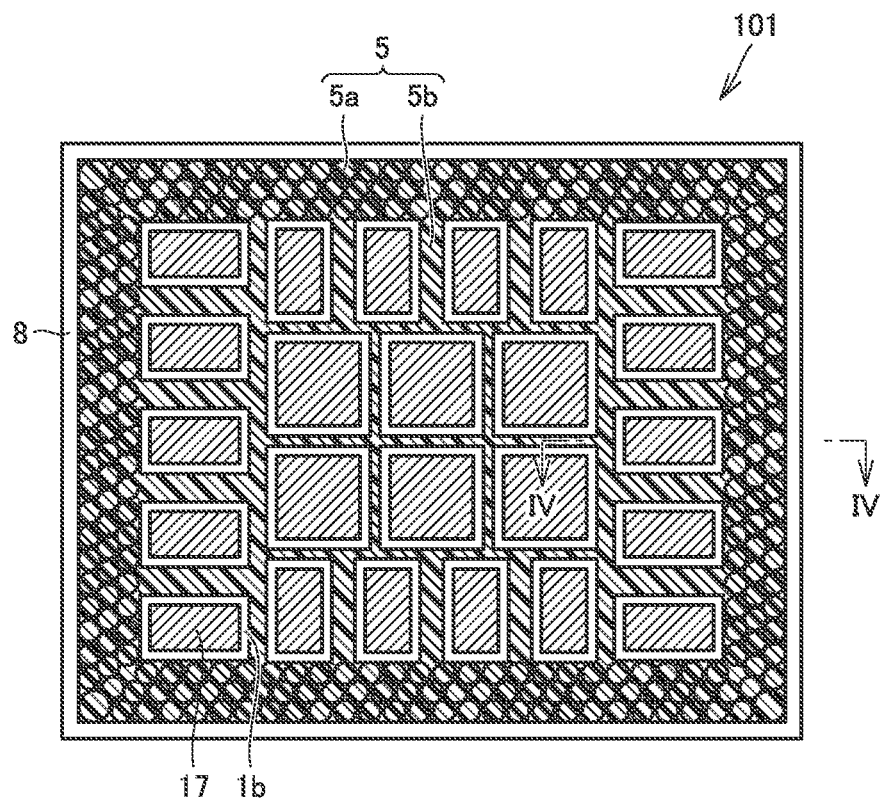
FIG. 3 is a bottom view of the module according to the first embodiment of the present disclosure.
Figure 4:
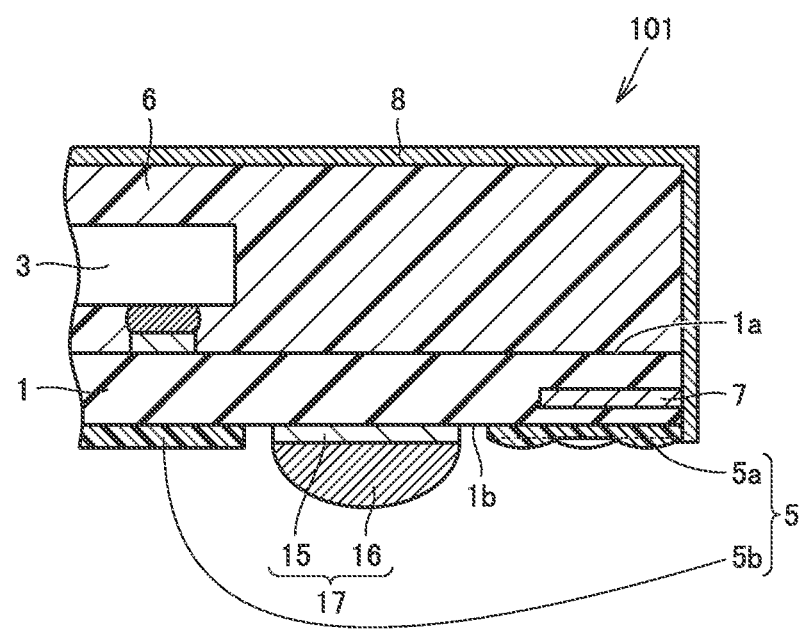
FIG. 4 is a cross-sectional view taken along a line arrow IV-IV in FIG. 3.

FIG. 1 shows an external appearance of a module 101 according to the present embodiment. An upper surface and a side surface of module 101 are covered with an external shield film 8. FIG. 2 shows module 101 viewed obliquely from below in FIG. 1. A lower surface of module 101 is not covered with external shield film 8. A plurality of external connection terminals 17 are disposed on the lower surface of module 101. A region other than external connection terminals 17 is covered with a resist film 5. FIG. 3 shows a bottom view of module 101. FIG. 4 shows a cross-sectional view taken along a line arrow IV-IV in FIG. 3.

Module 101 according to the present embodiment includes: a substrate 1 having a first surface 1a and a second surface 1b opposed to each other; a component 3 mounted on first surface 1a; a sealing resin 6 that covers first surface 1a and component 3; a shield film 8 formed to cover an upper surface and a side surface of sealing resin 6 and a side surface of substrate 1; and a resist film 5 formed to cover second surface 1b. Resist film 5 has a plurality of protrusions.

Figure 5:
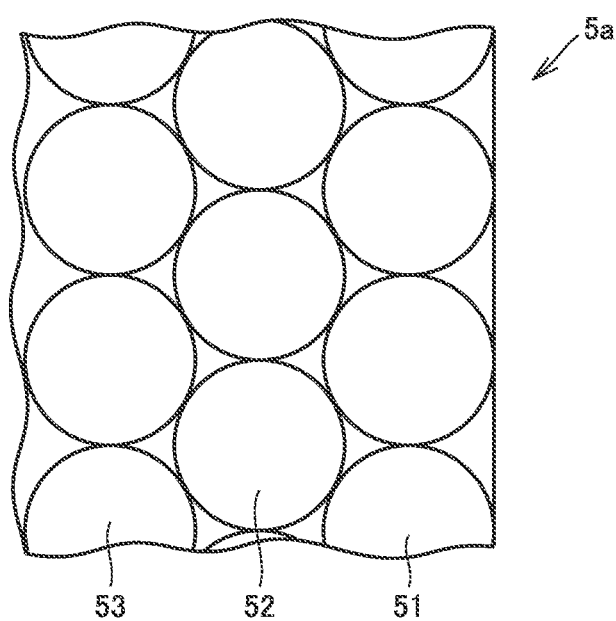
FIG. 5 is a plan view showing, in an enlarged manner, a part of an outer edge portion of a resist film provided in the module according to the first embodiment of the present disclosure.
Figure 6:
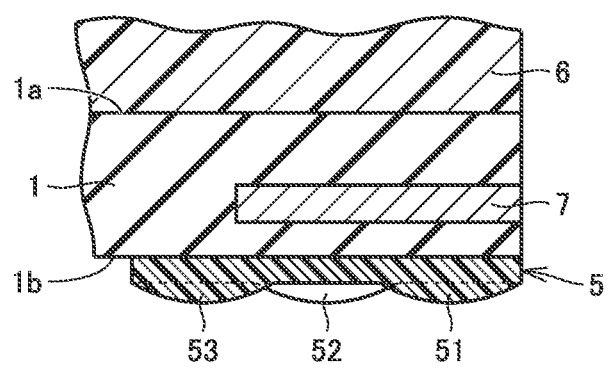
FIG. 6 is a cross-sectional view showing the outer edge portion of the resist film provided in the module according to the first embodiment of the present disclosure and the vicinity of the outer edge portion.

Resist film 5 includes an outer edge portion 5a and a non-outer edge portion 5b. Outer edge portion 5a is formed in a frame shape so as to surround a collection of external connection terminals 17 in FIG. 3. In other words, outer edge portion 5a is provided between a region where external connection terminals 17 are formed and an edge portion of substrate 1. In FIG. 3, outer edge portion 5a corresponds to a region in which a large number of small circles are shown. These small circles represent protrusions. Specifically, the plurality of protrusions are provided between the collection of external connection terminals 17 provided on second surface 1b and the edge portion of substrate 1. Non-outer edge portion 5b is disposed inside outer edge portion 5a. Non-outer edge portion 5b is also provided between external connection terminals 17. FIG. 5 is a plan view showing, in an enlarged manner, a part of outer edge portion 5a of resist film 5. Outer edge portion 5a includes a first row 51, a second row 52, and a third row 53. FIG. 6 is a cross-sectional view showing outer edge portion 5a and the vicinity thereof in the state where shield film 8 has been removed. As shown in FIG. 4, a ground electrode 7 is disposed inside substrate 1. An end surface of ground electrode 7 is exposed on the side surface of substrate 1. Shield film 8 is electrically connected to ground electrode 7 on the side surface of substrate 1. As shown in FIG. 4, external connection terminal 17 includes a land electrode 15 disposed on second surface 1b of substrate 1, and a solder bump 16 placed on land electrode 15. Non-outer edge portion 5b of resist film 5 is flat. Around external connection terminal 17, there is a region where second surface 1b of substrate 1 is exposed. The position where the protrusions are disposed is not limited to outer edge portion 5a. The protrusions may be disposed also in non-outer edge portion 5b.

In the present embodiment, resist film 5 has a plurality of protrusions, and thus, glue residue produced during peeling-off from the adhesive layer after formation of the shield film can be prevented. This will be described below in detail.

Figure 7:
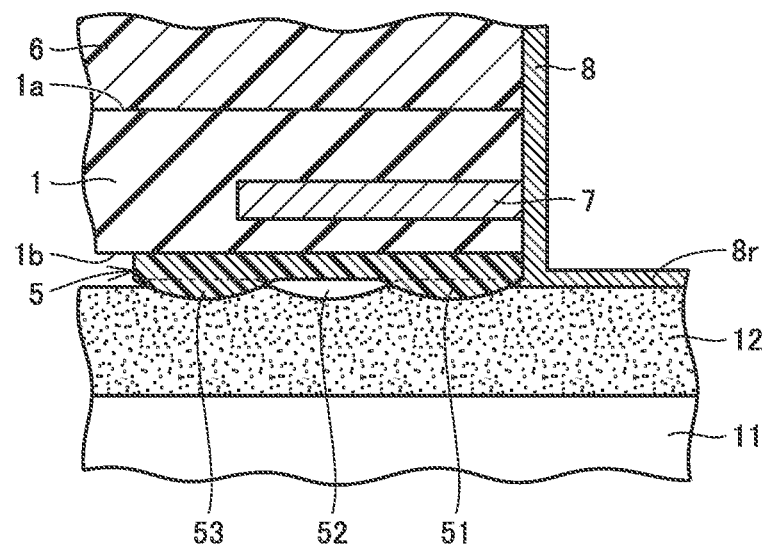
FIG. 7 is a first explanatory diagram of the state in which the module according to the first embodiment of the present disclosure is peeled off from an adhesive layer.
Figure 8:
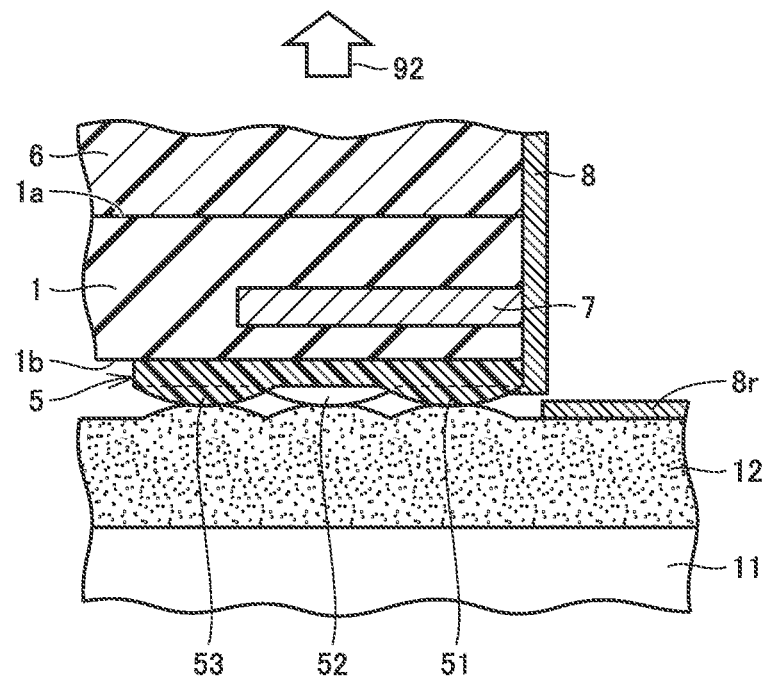
FIG. 8 is a second explanatory diagram of the state in which the module according to the first embodiment of the present disclosure is peeled off from the adhesive layer.
Figure 9:
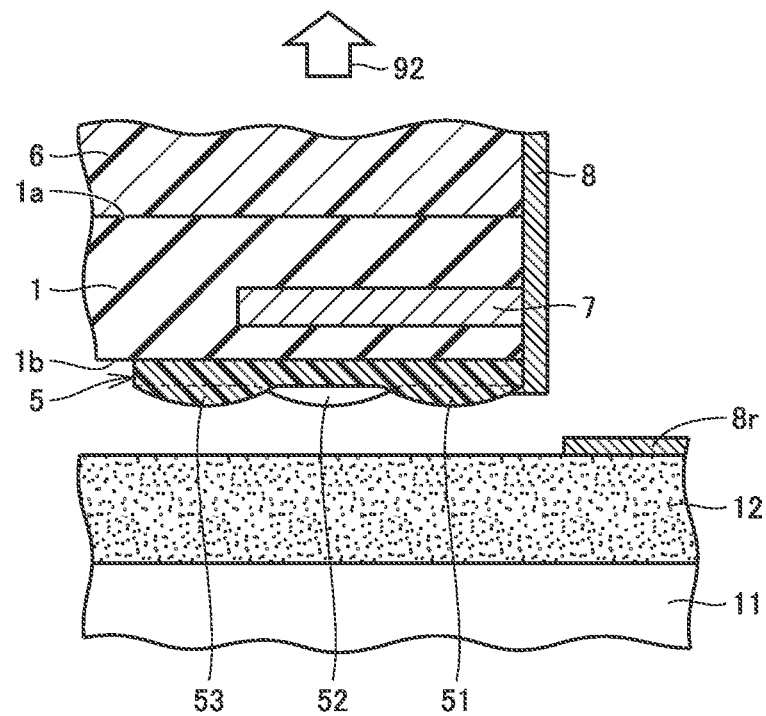
FIG. 9 is a third explanatory diagram of the state in which the module according to the first embodiment of the present disclosure is peeled off from the adhesive layer.

Referring to FIGS. 7 to 9, the following describes the state during peeling off from adhesive layer 12. Before starting the peeling operation, resist film 5 fits in adhesive layer 12 as shown in FIG. 7. Shield film 8 is formed by vapor deposition or the like. A conductive film 8r covering the upper surface of adhesive layer 12 is also formed as a portion contiguous from shield film 8. Shield film 8 and conductive film 8r are formed of the same material as a series of contiguous films. Conductive film 8r may include a portion formed to extend below first row 51 along the round portions of first row 51.

Then, as shown in FIG. 8, the module is lifted in the direction indicated by an arrow 92, so that shield film 8 and conductive film 8r are separated from each other. The tip end of each protrusion of resist film 5 still adheres to adhesive layer 12. Only the tip end of each protrusion adheres to adhesive layer 12, but other portions are already separated from adhesive layer 12. As the module is lifted, the area of contact between the module and adhesive layer 12 gradually decreases.

Then, as shown in FIG. 9, the module is further lifted in the direction indicated by arrow 92. Each protrusion of resist film 5 is completely separated from adhesive layer 12. Since resist film 5 has a plurality of protrusions as described above, the area of contact between the module and adhesive layer 12 gradually decreases during peeling-off from the adhesive layer after formation of the shield film, and then, the area of contact finally becomes zero. Therefore, the adhesive can be smoothly and sequentially peeled off. This can avoid such a phenomenon as what is called glue residue, in which a part of adhesive layer 12 is torn off and remains on the module side, for example, during peeling-off at one time in the state in which the area of contact is still relatively large. When the protrusions are disposed not only on outer edge portion 5a but also on non-outer edge portion 5b, the glue residue can be further reduced.

When a module is affixed to an adhesive layer, in addition to the problem of glue residue, there is conventionally another problem of intrusion of a conductive material forming a shield film. When the module is affixed to the adhesive layer, the module is not necessarily affixed uniformly in the correct posture, but may be affixed in a slightly inclined state or may be affixed in the state where there is a slight difference in height on the surface of the adhesive layer. As a result, there may be gaps locally between the module and the adhesive layer. When a conductive material to be formed as a shield film is attached in the state in which there are such gaps, the conductive material flows into the gaps, and an unnecessary conductive film may be formed on the back surface of the module. When the resist film is flat with no protrusion, there is also a possibility that this unnecessary conductive film may extend deeply. When the unnecessary conductive film not only adheres to the resist film but also reaches the external connection terminal, a short circuit occurs, which results in defects in a module.

The "conductive material" used herein is metal, for example. As a method for adhesion of a conductive material for forming a shield film, for example, sputtering can be adopted.

As shown in FIG. 5, it is preferable that the plurality of protrusions include a first row 51 in which protrusions are arranged along the outline of resist film 5 and a second row 52 in which protrusions are arranged inside first row 51, the protrusions adjacent to each other are in contact with each other in first row 51, the protrusions adjacent to each other are in contact with each other also in second row 52, second row 52 is in contact with first row 51, and second row 52 is disposed in a manner staggered from first row 51. In this case, the state in which "the second row is disposed in a manner staggered from the first row" means the state in which the outer shapes of the protrusions in one row and the outer shapes of the protrusions in the other row fit into each other. For example, referring to FIG. 5, a part of the outer shape of each protrusion in the second row extends into a gap between the circular protrusions disposed in contact with each other in the first row. More preferably, the second row is staggered from the first row by a length corresponding to a half of the size of one protrusion. Employing the above-described configuration can suppress occurrence of a phenomenon in which the conductive material deeply intrudes during formation of a shield film, which will be described below in detail.

Figure 10:
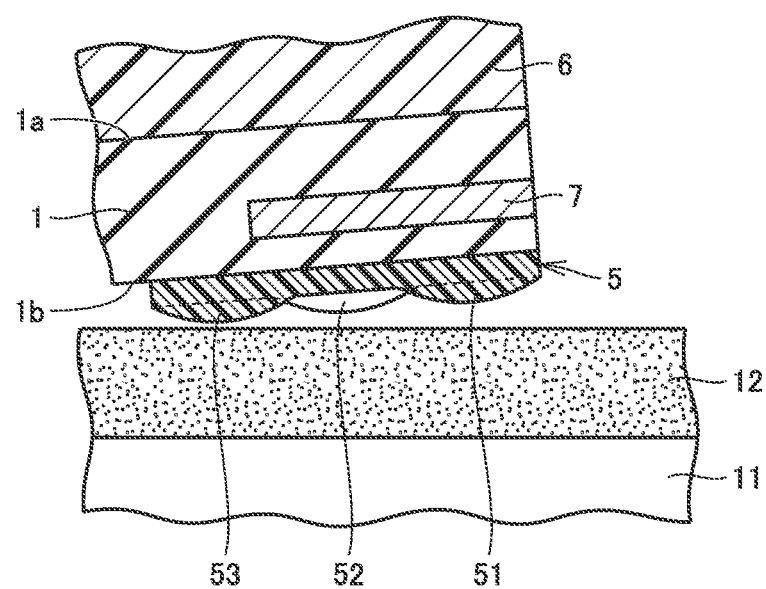
FIG. 10 is an explanatory diagram of the state in which there is a gap after the module according to the first embodiment of the present disclosure is affixed to the adhesive layer.
Figure 11:
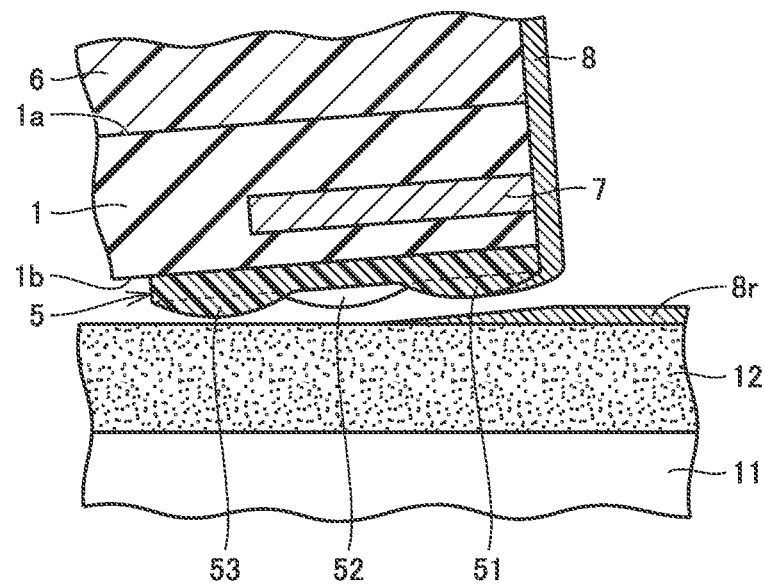
FIG. 11 is an explanatory diagram of the state after adhesion of a conductive material in the state shown in FIG. 10.
Figure 12:
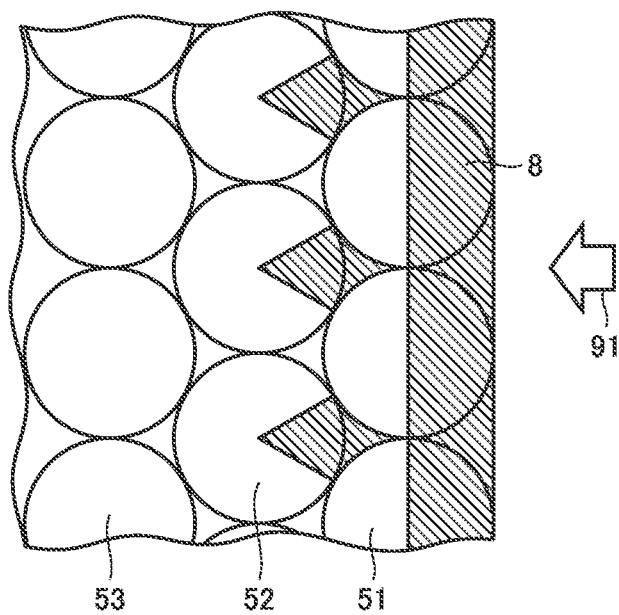
FIG. 12 is a partial plan view showing the outer edge portion of the resist film and the vicinity thereof after adhesion of the conductive material.
Figure 13:
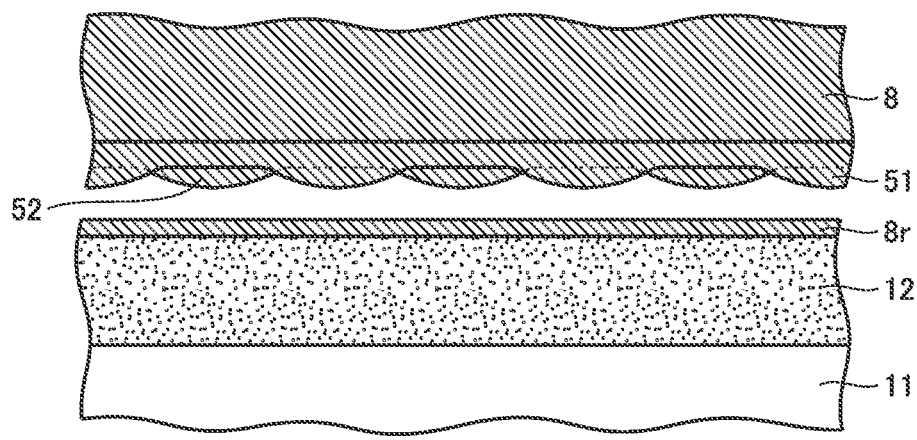
FIG. 13 is a partial side view showing the outer edge portion of the resist film and the vicinity thereof after adhesion of the conductive material.

In the present embodiment, resist film 5 has a plurality of protrusions. Thus, even if there are gaps as shown in FIG. 10, the result of adhesion of the conductive material is as shown in FIG. 11. Specifically, the conductive film is formed so as to cover approximately a half of each protrusion in first row 51 that faces outward. Outer edge portion 5a of resist film 5 in the lower surface of the module to which the conductive material has adhered is formed as shown in FIG. 12. FIG. 13 is a view taken in the direction indicated by an arrow 91 in FIG. 12. In this way, the intrusion of the conductive material is prevented to some extent by first row 51. Further, since second row 52 is disposed in a manner staggered from first row 51 by a length corresponding to a half of the size of each protrusion, a gap is less likely to be formed between the outside and the inside of the module, and thereby, intrusion of the conductive material through the gap in first row 51 is also substantially prevented by second row 52. As a result, it is possible to suppress occurrence of a phenomenon in which the conductive material deeply intrudes during formation of shield film 8.

Second Embodiment

Figure 14:
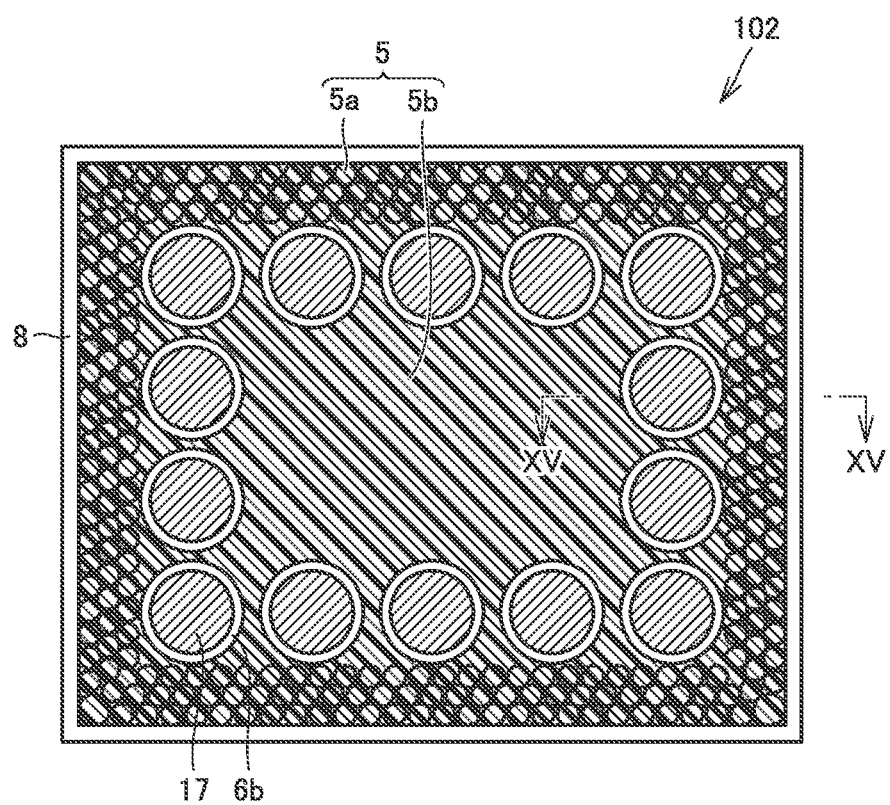
FIG. 14 is a bottom view of a module according to a second embodiment of the present disclosure.
Figure 15:
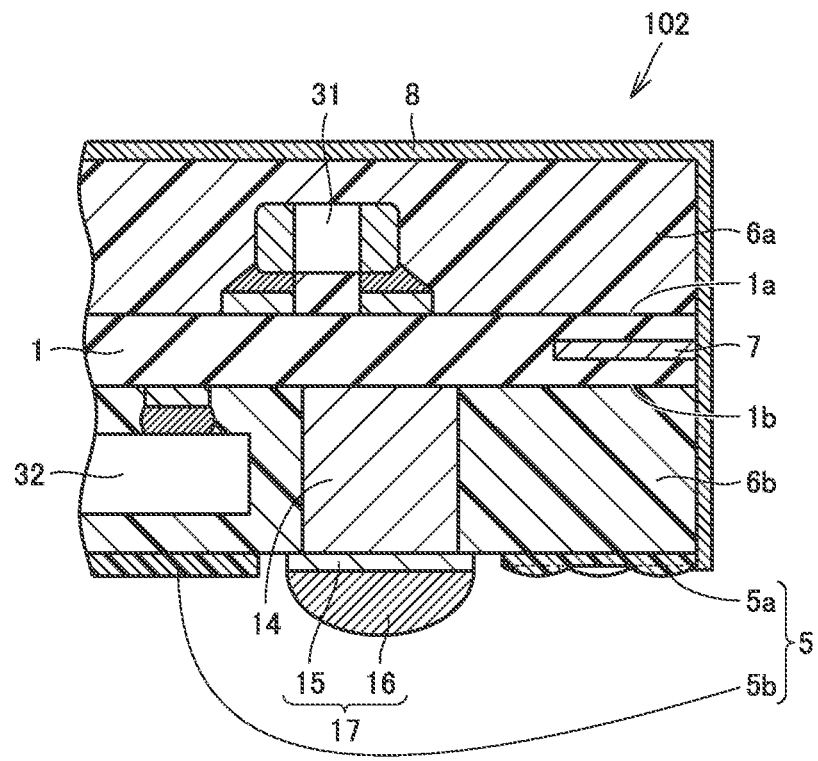
FIG. 15 is a cross-sectional view taken along a line arrow XV-XV in FIG. 14.

A module according to the second embodiment of the present disclosure will be hereinafter described with reference to FIGS. 14 and 15. FIG. 14 is a bottom view of a module 102 according to the present embodiment. FIG. 15 is a cross-sectional view taken along a line arrow XV-XV in FIG. 14.

A module 102 according to the present embodiment includes: a substrate 1 having a first surface 1a and a second surface 1b that constitute a front surface and a back surface, respectively; a first component 31 mounted on first surface 1a; a second component 32 mounted on second surface 1b; a first sealing resin 6a that covers first surface 1a and first component 31; a second sealing resin 6b that covers second surface 1b and second component 32; a shield film 8 formed to cover an upper surface and a side surface of first sealing resin 6a, a side surface of substrate 1, and a side surface of second sealing resin 6b; and a resist film 5 that covers a surface of second sealing resin 6b, the surface of second sealing resin 6b being located on the side farther from second surface 1b. Resist film 5 has a plurality of protrusions.

Resist film 5 includes an outer edge portion 5a and a non-outer edge portion 5b. Outer edge portion 5a is formed in a frame shape so as to surround the arrangement of external connection terminals 17 in FIG. 14. In other words, outer edge portion 5a is provided between a region where external connection terminals 17 are formed and an edge portion of substrate 1. Non-outer edge portion 5b is disposed inside outer edge portion 5a. Non-outer edge portion 5b is also formed in a gap between external connection terminals 17. Further, non-outer edge portion 5b is also formed in a central large area surrounded by the arrangement of external connection terminals 17.

A column-shaped electrode 14 is provided to stand upright on second surface 1b of substrate 1. Column-shaped electrode 14 extends through second sealing resin 6b. A land electrode 15 is disposed so as to cover the end surface of column-shaped electrode 14 on the side farther from second surface 1b. A solder bump 16 is disposed to overlap with land electrode 15. Land electrode 15 may be completely covered with solder bump 16. Module 102 includes an external connection terminal 17. External connection terminal 17 includes land electrode 15 and solder bump 16.

Also in the present embodiment, the effect similar to that described in the first embodiment can be achieved. In the present embodiment, components are mounted on both surfaces of substrate 1. Accordingly, a larger number of components can be mounted even if the area of substrate 1 is the same as that in the first embodiment. Mounting a relatively large number of components makes it easier to implement a highly advanced module.

Third Embodiment

Figure 16:
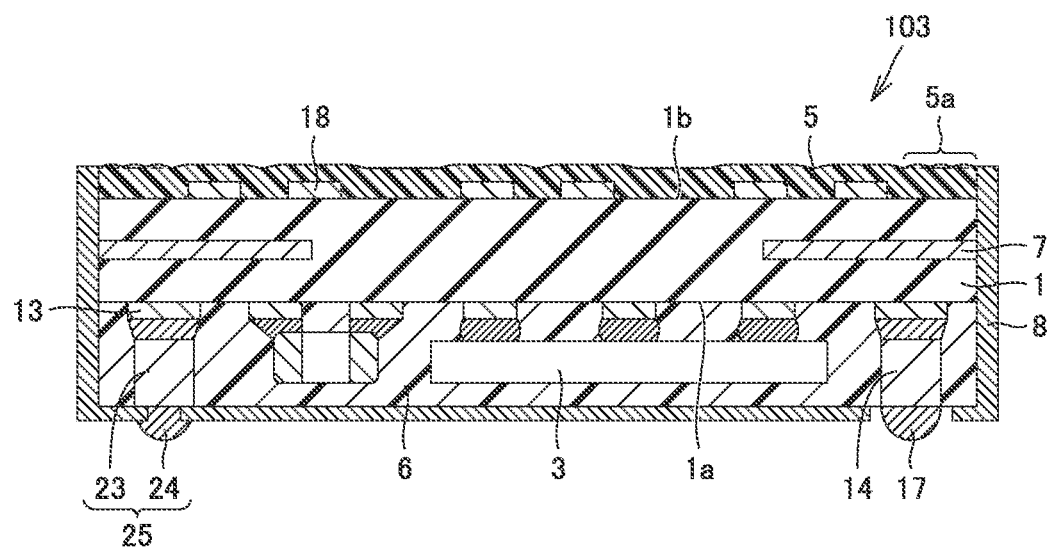
FIG. 16 is a cross-sectional view of a module according to a third embodiment of the present disclosure.
Figure 17:
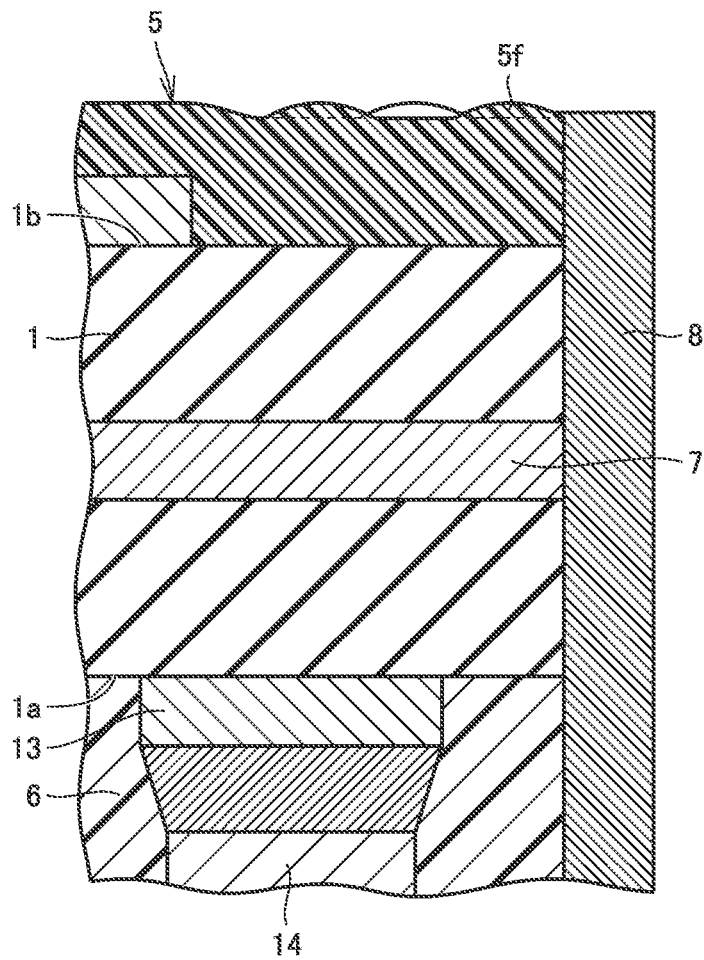
FIG. 17 is a cross-sectional view showing, in an enlarged manner, a part of the module according to the third embodiment of the present disclosure.

A module according to the third embodiment of the present disclosure will be hereinafter described with reference to FIGS. 16 and 17. FIG. 16 is a cross-sectional view of a module 103 in the present embodiment. FIG. 17 is an enlarged view of a portion in FIG. 16. In the present embodiment, the relation between first surface 1a and second surface 1b of substrate 1 is reversed as compared with those in the embodiments described above. Specifically, first surface 1a faces downward in the figure while second surface 1b faces upward in the figure.

Module 103 according to the present embodiment includes: a substrate 1 having a first surface 1a and a second surface 1b that constitute a front surface and a back surface, respectively; a component 3 mounted on first surface 1a; an antenna electrode 18 disposed on second surface 1b; a sealing resin 6 that covers first surface 1a and component 3; a shield film 8 formed to cover a surface and a side surface of sealing resin 6, and a side surface of substrate 1, the surface of sealing resin 6 being located on the side farther from first surface 1a; and a resist film 5 formed to cover at least an outer edge portion of second surface 1b. Resist film 5 covers antenna electrode 18. Resist film 5 has a plurality of protrusions.

Also in the present embodiment, the effect similar to that described in the first embodiment can be achieved. In the present embodiment, antenna electrode 18 is disposed on second surface 1b of substrate 1, which allows wireless communication through antenna electrode 18.

Fourth Embodiment

Figure 18:
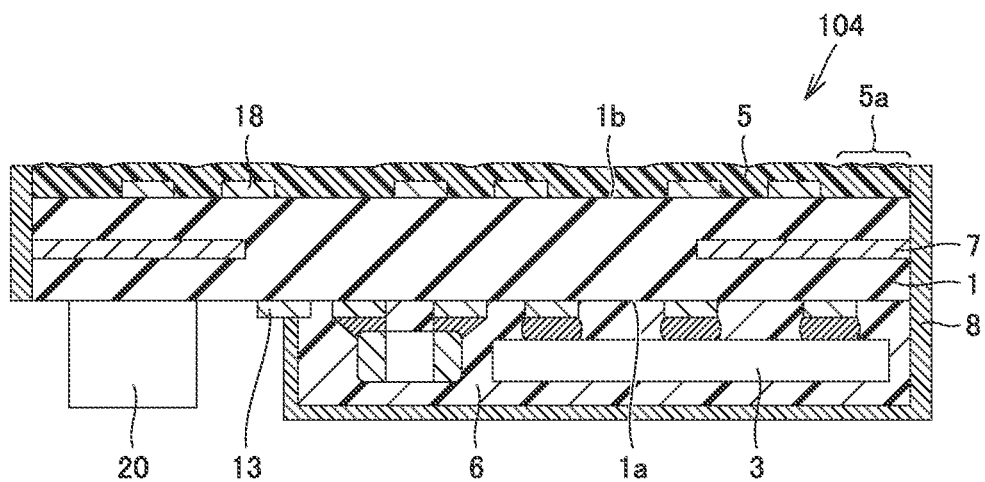
FIG. 18 is a cross-sectional view of a module according to a fourth embodiment of the present disclosure.
Figure 19:
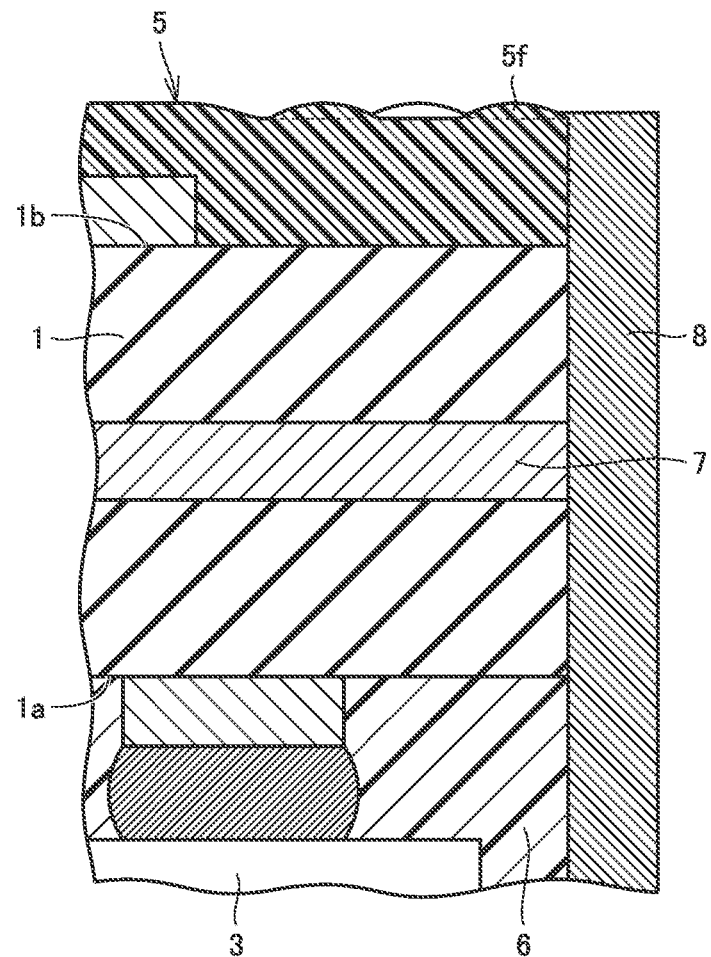
FIG. 19 is a cross-sectional view showing, in an enlarged manner, a part of the module according to the fourth embodiment of the present disclosure.

A module according to the fourth embodiment of the present disclosure will be hereinafter described with reference to FIGS. 18 and 19. FIG. 18 is a cross-sectional view of a module 104 in the present embodiment. FIG. 19 is an enlarged view of a portion in FIG. 18. Also in the present embodiment, first surface 1a faces downward in the figure while second surface 1b faces upward in the figure, as in the third embodiment. In the present embodiment, sealing resin 6 does not entirely cover first surface 1a, but covers only a part of first surface 1a. A part of first surface 1a is not covered with sealing resin 6 but is exposed. A connector 20 is disposed in a region where first surface 1a is exposed. Connector 20 may be based on known techniques. Connector 20 may allow attachment and detachment of the other-side connector in the direction parallel to first surface 1a of substrate 1, or may allow attachment and detachment of the other-side connector in the direction perpendicular to first surface 1a of substrate 1.

At a position where shield film 8 covering the side surface of sealing resin 6 comes into perpendicular contact with first surface 1a, an electrode 13 is provided on first surface 1a, and electrode 13 is electrically connected to shield film 8. Also, electrode 13 is grounded.

In the present embodiment, module 104 includes connector 20, and thereby, connection to the outside can be readily established through connector 20. In this case, no external connection terminal needs to be provided in sealing resin 6.

As in any of the embodiments described above, it is preferable that each of the protrusions is shaped to have a cross-sectional area that decreases away from substrate 1. Employing the above-described configuration makes it easier to create a situation in which the area of contact gradually decreases during peeling-off, with the result that glue residue can be effectively avoided. The shape having a cross-sectional area that decreases away from substrate 1 may be, for example, a dome shape, a hemispherical shape, a conical shape, or a pyramid shape.

As in any of the embodiments described above, it is preferable that each of the protrusions has a dome shape. Employing the above-described configuration stabilizes the shape of each of the protrusions. Therefore, a plurality of protrusions can be formed with stability.

The following describes some modifications of resist film 5. Each of the modifications of resist film 5 described below can be applicable to any of the embodiments described above. Note that FIGS. 20 to 24 each do not show shield film 8.

First Modification

Figure 20:
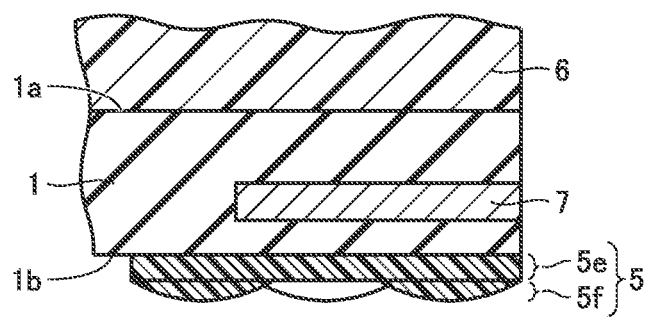
FIG. 20 is a partial cross-sectional view of the module according to the present disclosure for illustrating a first modification of the resist film.

A first modification of resist film 5 will be hereinafter described with reference to FIG. 20. In the present example, resist film 5 includes a base layer 5e and a protrusion layer 5f. Base layer 5e is formed to be flat with a constant thickness. Each protrusion layer 5f is formed in a dome shape. Base layer 5e and protrusion layer 5f may be formed in separate steps. Specifically, protrusion layer 5f may be formed after base layer 5e is formed to be flat with a constant thickness. Individual protrusion layers 5f may have independent shapes. Each protrusion layer 5f can be formed, for example, by solidifying drips of the liquefied material of resist film 5 onto the surface of base layer 5e. Base layer 5e and protrusion layer 5f may be formed of the same material or may be formed of different materials.

Second Modification

Figure 21:
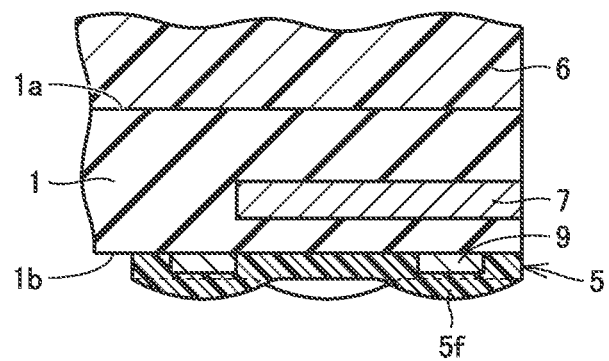
FIG. 21 is a partial cross-sectional view of the module according to the present disclosure for illustrating a second modification of the resist film.

The second modification of resist film 5 will be hereinafter described with reference to FIG. 21. In the present example, a substrate protrusion 9 is provided on second surface 1b of substrate 1. Substrate protrusion 9 may be made of metal, for example. Protrusion layer 5f is formed with a constant thickness so as to cover second surface 1b and substrate protrusion 9. Since protrusion layer 5f is formed so as to follow substrate protrusion 9, protrusion layer 5f is naturally shaped to protrude in a region where substrate protrusion 9 exists. Protrusion layer 5f can be formed, for example, by applying some type of material with a constant thickness.

Third Modification

Figure 22:
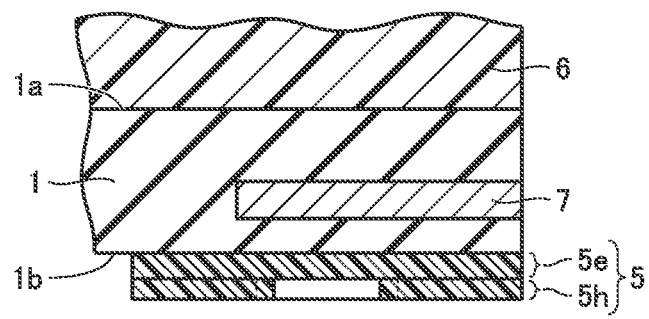
FIG. 22 is a partial cross-sectional view of the module according to the present disclosure for illustrating a third modification of the resist film.

A third modification of resist film 5 will be hereinafter described with reference to FIG. 22. In the present example, resist film 5 includes a base layer 5e and a protrusion layer 5h. Base layer 5e is formed to be flat with a constant thickness. Each protrusion layers 5h is formed in a cylindrical shape. Base layer 5e and protrusion layer 5h may be formed in separate steps. Specifically, protrusion layer 5h may be formed after base layer 5e is formed to be flat with a constant thickness. Alternatively, a layer having both thicknesses of base layer 5e and protrusion layer 5h may be first formed, and then protrusion layer 5h may be formed by a removal process. The removal process used herein may be etching, for example. Base layer 5e and protrusion layer 5h may be formed of the same material or may be formed of different materials. Protrusion layer 5h may have a prism shape in place of a cylindrical shape.

Fourth Modification

Figure 23:
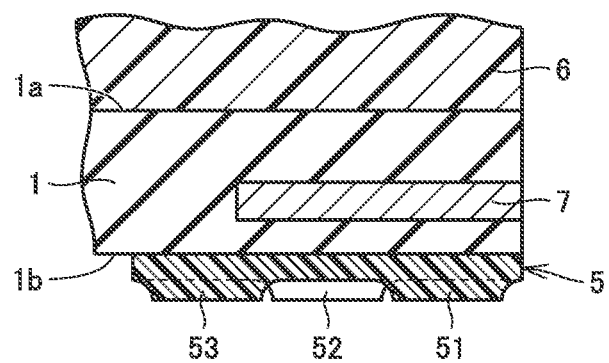
FIG. 23 is a partial cross-sectional view of the module according to the present disclosure for illustrating a fourth modification of the resist film.

A fourth modification of resist film 5 will be hereinafter described with reference to FIG. 23. In the present example, each of the plurality of protrusions in resist film 5 has a flat end. Each of the plurality of protrusions is inclined steeper away from substrate 1. The structure as described above can be formed by etching, for example.

Fifth Modification

Figure 24:
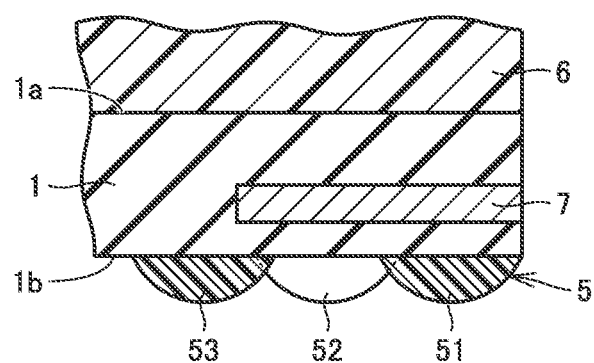
FIG. 24 is a partial cross-sectional view of the module according to the present disclosure for illustrating a fifth modification of the resist film.

A fifth modification of resist film 5 will be hereinafter described with reference to FIG. 24. In the present example, dome-shaped protrusions are provided directly on second surface 1b of substrate 1. The protrusions are independent of each other. Second surface 1b may be exposed in a portion where no protrusion exists. The structure as described above can be formed, for example, by dripping the liquefied material of resist film 5 onto second surface 1b.

Among the above-described embodiments, some of the embodiments may be employed in an appropriate combination. The above embodiments disclosed herein are illustrative in all respects and should not be construed as being restrictive. The scope of the present disclosure is defined by the terms of the claims, and is intended to include any modifications within the meaning and scope equivalent to the terms of the claims.

1 substrate, 3, 31, 32 component, 5 resist film, 5*a* outer edge portion, 5*b* non-outer edge portion, 5*e* base layer, 5*f*, 5*h* protrusion layer, 6 sealing resin, 7 ground electrode, 8 shield film, 8*r* conductive film, 9 substrate protrusion, 11 holder, 12 adhesive layer, 13 electrode, 14 column-shaped electrode, 15 land electrode, 16 solder bump, 17 external connection terminal, 18 antenna electrode, 20 connector, 23 column-shaped electrode (of ground terminal), 24 solder bump (of ground terminal), 25 ground terminal, 51 first row, 52 second row, 53 third row, 91, 92 arrow, 101, 102, 103, 104 module.

The invention claimed is:

1. A module comprising:
  a substrate having a first surface and a second surface opposed to each other;
  a component mounted on the first surface;
  a sealing resin covering the first surface and the component;
  a shield film provided to cover an upper surface and a side surface of the sealing resin and a side surface of the substrate; and
  a resist film provided to cover the second surface, wherein the resist film has a plurality of regularly arranged protrusions.

2. The module according to claim 1, wherein the protrusions are provided between an external connection terminal provided on the second surface and an edge portion of the substrate.

3. The module according to claim 2, wherein
  the protrusions include
    a first row in which first ones of the protrusions are arranged along an outline of the resist film, and
    a second row in which second ones of the protrusions are arranged inside the first row,
  adjacent ones of the first ones of the protrusions are in contact with each other in the first row,
  adjacent ones of the second ones of the protrusions are in contact with each other in the second row,
  the second row is in contact with the first row, and
  the second row is disposed in a manner staggered from the first row.

4. The module according to claim 2, wherein each of the protrusions is shaped to have a cross-sectional area that decreases away from the substrate.

5. The module according to claim 1, wherein
  the protrusions include
    a first row in which first ones of the protrusions are arranged along an outline of the resist film, and
    a second row in which second ones of the protrusions are arranged inside the first row,
  adjacent ones of the first ones of the protrusions are in contact with each other in the first row,
  adjacent ones of the second ones of the protrusions are in contact with each other in the second row,
  the second row is in contact with the first row, and
  the second row is disposed in a manner staggered from the first row.

6. The module according to claim 5, wherein the second row is staggered from the first row by a length corresponding to a half of a size of each of the protrusions.

7. The module according to claim 5, wherein each of the protrusions is shaped to have a cross-sectional area that decreases away from the substrate.

8. The module according to claim 6, wherein each of the protrusions is shaped to have a cross-sectional area that decreases away from the substrate.

9. The module according to claim 1, wherein each of the protrusions is shaped to have a cross-sectional area that decreases away from the substrate.

10. The module according to claim 9, wherein each of the protrusions has a dome shape.

11. A module comprising:
  a substrate having a first surface and a second surface opposed to each other;
  a first component mounted on the first surface;
  a second component mounted on the second surface;
  a first sealing resin covering the first surface and the first component;
  a second sealing resin covering the second surface and the second component;
  a shield film provided to cover an upper surface and a side surface of the first sealing resin, a side surface of the substrate, and a side surface of the second sealing resin; and
  a resist film covering a surface of the second sealing resin located on a side farther from the second surface, wherein
  the resist film has a plurality of regularly arranged protrusions.

12. The module according to claim 11, wherein the protrusions are provided between an external connection terminal provided on the second surface and an edge portion of the substrate.

13. The module according to claim 11, wherein
  the protrusions include
    a first row in which first ones of the protrusions are arranged along an outline of the resist film, and
    a second row in which second ones of the protrusions are arranged inside the first row,
  adjacent ones of the first ones of the protrusions are in contact with each other in the first row,
  adjacent ones of the second ones of the protrusions are in contact with each other in the second row,
  the second row is in contact with the first row, and
  the second row is disposed in a manner staggered from the first row.

14. The module according to claim 11, wherein each of the protrusions is shaped to have a cross-sectional area that decreases away from the substrate.

15. A module comprising:
  a substrate having a first surface and a second surface opposed to each other;
  a component mounted on the first surface;
  an antenna electrode disposed on the second surface;
  a sealing resin covering the first surface and the component;
  a shield film provided to cover a side surface of the sealing resin, and a side surface of the substrate, and a surface of the sealing resin located on a side farther from the first surface; and
  a resist film provided to cover the second surface, wherein
  the resist film covers the antenna electrode, and
  the resist film has a plurality of protrusions.

16. The module according to claim 15, wherein
  the protrusions include
    a first row in which first ones of the protrusions are arranged along an outline of the resist film, and
    a second row in which second ones of the protrusions are arranged inside the first row, adjacent ones of the first ones of the protrusions are in contact with each other in the first row,
adjacent ones of the second ones of the protrusions are in contact with each other in the second row,
the second row is in contact with the first row, and
the second row is disposed in a manner staggered from the first row.

17. The module according to claim 15, wherein each of the protrusions is shaped to have a cross-sectional area that decreases away from the substrate.

* * * * *